United States Patent [19]

Fandrich

[11] Patent Number: 5,574,850
[45] Date of Patent: Nov. 12, 1996

[54] CIRCUITRY AND METHOD FOR RECONFIGURING A FLASH MEMORY

[75] Inventor: Mickey L. Fandrich, Placerville, Calif.

[73] Assignee: Intel Corporation, Santa Clara, Calif.

[21] Appl. No.: 629,785

[22] Filed: Apr. 9, 1996

Related U.S. Application Data

[63] Continuation of Ser. No. 512,858, Aug. 8, 1995, abandoned, which is a continuation of Ser. No. 141,126, Oct. 20, 1993, abandoned.

[51] Int. Cl.$^6$ ...................................................... G06F 11/00
[52] U.S. Cl. ......................................................... 395/182.03
[58] Field of Search .......................... 371/11; 395/182.03

[56] References Cited

U.S. PATENT DOCUMENTS

| | | | |
|---|---|---|---|
| 4,963,768 | 10/1990 | Agrawal et al. | 307/465 |
| 5,331,571 | 7/1994 | Aronoff et al. | 364/490 |

OTHER PUBLICATIONS

"28F008SA–L 8–Bit (1 MBit×8) Flashfile™ Memory," Intel Flash Memory Handbook, vol. 1, pp. 3–77 through 3–104 (1994).

"28F008SA 8–MBit (1–MBit×8) Flashfile™ Memory," Intel Flash Memory Handbook, vol. 1, pp. 3–49 through 3–76.

*Primary Examiner*—Vincent P. Canney
*Attorney, Agent, or Firm*—Blakely, Sokoloff, Taylor & Zafman

[57] ABSTRACT

Circuitry for reconfiguring a pin of an integrated circuit. The reconfiguration circuitry includes a multiplexer, whose output is coupled to the pin. Upon powering-up the integrated circuit, the multiplexer couples to the pin to a first signal that conforms to the historical definition of the pin's function. The user reconfigures the pin by issuing a command that causes the multiplexer to couple a second signal to the pin. This second signal behaves in a manner more useful to the user. The switch from the first signal to the second is achieved via a reconfiguration register, which generates the multiplexer's select signal. A control engine within the integrated circuit responds to the reconfiguration command by writing once to the reconfiguration register. The pin remains reconfigured until the integrated device is powered down.

23 Claims, 8 Drawing Sheets

TABLE 1

| INPUTS | | | | OUTPUT |
|---|---|---|---|---|
| DPPWRDWN | SELECT | PULSED R/B | LEVEL R/B | RDY/!BSY |
| 1 | 0 | X | 0 | 0 |
| 1 | 0 | X | 1 | 1 |
| 0 | 0 | X | 0 | 0 |
| 0 | 0 | X | 1 | 1 |
| 0 | 1 | 0 | X | 0 |
| 0 | 1 | 1 | X | 1 |

FIG. 3

CIRCUITRY AND METHOD FOR RECONFIGURING A FLASH MEMORY

This is a continuation of application Ser. No. 08/512,858, filed Aug. 8, 1995, now abandoned, which is a continuation of application Ser. No. 08/141,126, filed Oct. 20, 1993, now abandoned.

FIELD OF THE INVENTION

The present invention relates to integrated circuits. More particularly, the present invention relates to reconfiguration circuitry that allows modification of an integrated circuit subsequent to its manufacture and while the integrated circuit is operating.

BACKGROUND OF THE INVENTION

One prior nonvolatile semiconductor memory is the flash electrically erasable programmable read-only memory ("flash" memory). Flash memories are programmed electrically and, once programmed, retain their data until erased. After erasure, flash memories may be programmed with new code or data.

Flash memories differ from conventional electrically erasable programmable read-only memories ("EEPROM") with respect to erasure. Conventional EEPROMS typically use a select transistor for individual byte erasure control. Flash memories, on the other hand, typically achieve much higher densities using single transistor cells. Some prior flash memories are erased by applying a high voltage to the source of every memory cell in the memory array simultaneously. This results in full array erasure.

Flash memory conventions define a logical one as few, if any, electrons stored on the floating gate of a memory cell. Convention also defines a logical zero as many electrons stored on the floating gate of a memory cell. Erasure of a flash memory array causes a logical one to be stored in each memory cell of the array. Flash memory cells cannot be overwritten individually from a logical zero to a logical one without prior erasure. However, a flash memory cell can be overwritten individually from a logical one to a logical zero, because this entails simply adding electrons to the floating gate, which contains the intrinsic number of electrons associated with a logic one.

The process for erasure, programming and verification of flash memories requires careful control of the voltages required to perform those steps. For example, one prior art flash memory is the 28F256 complimentary metal oxide semiconductor ("CMOS") flash memory sold by Intel Corporation of Santa Clara, Calif., which is a 256 kilobit flash memory. The flash memory includes a command register to manage electrical erasure and reprogramming. Commands are written for erasure from a controlling microprocessor using standard microprocessor write timings. The command register contents serve as input to an internal state machine that controls erasure and programming circuitry.

A disadvantage of prior flash memories, and most integrated circuits, is their inflexibility after trimming at sort. At sort, defective memory locations within a flash memory can be replaced with redundant memory elements by programming content addressable memories (CAMs). Also, program voltage levels can be trimmed at sort by programming other CAMs. However, once the available CAMS have been programmed no further modification of the integrated circuit's operation is possible. Thus, program voltage levels cannot be trimmed to account for a memory array's changing program characteristics with time. Nor can memory locations that become defective after sort be replaced.

Another disadvantage of prior flash memories and some prior integrated circuits is their inability to redefine pin functions subsequent to sort. By producing integrated circuits that conform with historical pin definitions, an integrated device manufacturer may lose other customers who require non-historic pin definitions.

SUMMARY OF THE INVENTION

An object of the present invention is to provide a method and circuitry that permits modification of an integrated circuit subsequent to its manufacture and while the integrated circuit is operating.

Another object of the present invention to provide a method and circuitry that allows an integrated circuit user to repeatedly reconfigure a pin during operation so that the pin's function conforms to the user's needs at any particular moment.

Another object of the present invention is to provide an inexpensive and reliable replacement for content addressable memories in integrated circuits.

A still further object of the present invention is to allow trimming of program voltage levels after sort.

Circuitry for reconfiguring a pin of an integrated circuit is described. The circuitry includes a multiplexer, whose output is coupled to the pin. Upon powering-up the integrated circuit, the multiplexer couples to the pin a first signal, which conforms to the historical definition of the pin's function. The user reconfigures the pin by issuing a reconfiguration command that causes the multiplexer to couple a second signal to the pin. This second signal behaves in a non-historic manner, which is more useful to the user. The switch from the first signal to the second signal is achieved via a reconfiguration register, which generates the multiplexer's select signal. A control engine within the integrated circuit responds to the reconfiguration command by writing once to the reconfiguration register. The pin remains reconfigured until the integrated device is powered down.

Also described is a reconfiguration register that replaces content addressable memories as means for activating redundant memory elements and as means for trimming program voltage levels after manufacture. The reconfiguration register includes an addressable flip-flop that is written to by a control engine upon powering-up of the integrated circuit. The register is written to once per power-up and retains its data until the integrated circuit is powered down.

Other objects, features, and advantages of the present invention will be apparent from the accompanying drawings and the detailed description that follows.

BRIEF DESCRIPTION OF THE FIGURES

The present invention is illustrated by way of example and not limitation in the figures of the accompanying drawings in which references indicate similar elements and in which:

FIG. 3 illustrates Table I, which defines the signal output on a RDY/!BSY pin in response to various input signals.

DETAILED DESCRIPTION

Figure 1:
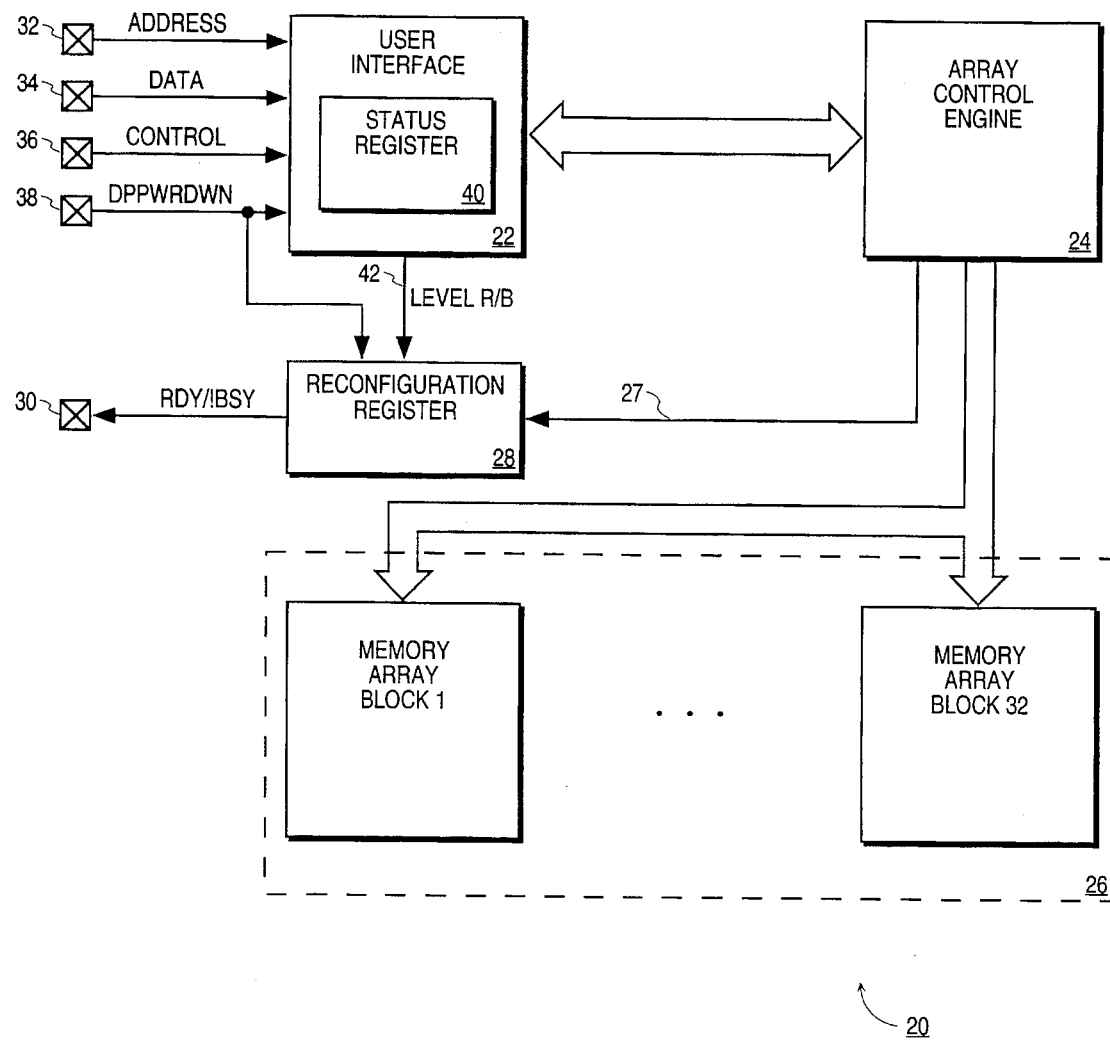
FIG. 1 is a block diagram of a nonvolatile memory device.

FIG. 1 illustrates in block diagram form nonvolatile memory device 20, which includes the circuitry and method of the present invention. Memory device 20 includes user interface 22, array control engine 24, nonvolatile memory array 26 and reconfiguration circuit 28. Nonvolatile memory array 26 is preferably organized as 32 blocks of flash memory, each providing 64 k bytes of data storage. Array control engine 24 coordinates all activities involved in executing commands to read, program or erase memory array 26. The status of array control engine 24 is indicated to the memory device user via the signal output to RDY/!BSY pin 30.

As will be described in more detail below, reconfiguration circuit 28 allows the memory device user to reconfigure RDY/!BSY pin 30 subsequent to manufacture and while memory device 20 is operating. Briefly, reconfiguration circuit 28 includes a multiplexer that selects which of two differently defined signals is coupled to RDY/!BSY pin 30. Array control engine 24 uses a reconfiguration register to select between the two signals in response to a reconfiguration command from the memory device user. By changing the value stored in the reconfiguration register, array control engine 24 changes the signal coupled to pin 30 and, thus, the configuration of RDY/!BSY pin 30. Pin 30 remains defined according to the user's command while memory device 20 is powered up.

Other reconfiguration circuits will also be described in detail. These embodiments automatically modify memory device 20 subsequent to manufacture without reconfiguration commands. In one embodiment, a reconfiguration register replaces a content addressable memory (CAM) to activate redundant memory elements. In yet another embodiment, a reconfiguration register allows trimming of program voltage levels.

Prior to beginning a detailed discussion of reconfiguration registers and circuits, again consider FIG. 1. As its name implies, user interface 22 functions as an interface between the memory device user and the rest of memory device 20. The memory device user communicates commands to user interface 22 via the signals coupled to address pins 32, data pins 34 and control pins 36. User interface 22 decodes user commands and, when they require operation upon nonvolatile memory array 26, communicates the commands to array control engine 24. User interface 22 also receives a deep power down signal, DPPWRDWN, via pin 38. In response to the active state of DPPWRDWN 38, user interface 22 powers down memory device 20.

User interface 22 informs the memory device user of the status of array control engine 24 via status register 40. Status register 40 includes a number of status bits, one of which is Level R/B 42. Level R/B signal 42 indicates that array control engine 24 is ready to execute another command, such as a program or erase, via its active high state. Conversely, Level R/B signal 42 indicates that array control engine 24 is busy executing a command via its inactive low state. Level R/B signal 42 can be coupled to RDY/!BSY pin 30, and the memory device user, via reconfiguration circuit 28.

Array control engine 24 is responsible for executing user commands that involve memory array 26. These commands include program, read, erase and reconfiguration. Program, read and erase commands are well known in the art and will not be discussed in detail herein. Array control engine 24 responds to reconfiguration commands by modifying the operation of memory device 20 via reconfiguration registers. Thus, reconfiguration commands permit post-sort modification of the operation of memory device 20. Further, reconfiguration commands permit modification of memory device 20 while it is running.

In one embodiment, a reconfiguration command causes array control engine 24 to reconfigure RDY/!BSY pin 30. As used herein, reconfiguring RDY/!BSY pin 30 means redefining the signal output on RDY/!BSY pin 30. Prior to receipt of a reconfigure command, pin 30 is configured according to its historical definition, to which Level R/B signal 42 conforms. In other words, prior to receipt of a reconfiguration command, reconfiguration circuit 28 couples Level R/B signal 42 to RDY/!BSY pin 30. After receipt of a reconfiguration command, array control engine 24 causes reconfiguration circuit 28 to couple another signal, which behaves differently, to RDY/!BSY pin 30. In one embodiment, after reconfiguration, the signal on RDY/!BSY pin 30 pulses low on completion of a command. For example, pulsing low RDY/!BSY pin 30 may indicate completion of a program command or an erase command. For this reason, these reconfiguration commands are also called "Pulse-On Completion" commands.

Array control engine 24 is a general purpose processing device. In one embodiment, array control engine 24 includes a nonvolatile program store, a program counter, an instruction register, an arithmetic logic unit (ALU) and several registers. The nonvolatile program store stores the algorithms used by array control engine 24 to execute various user commands, including those used to perform pulse-on completion commands. Appropriate coding of the program store allows array control engine 24 to modify the operation of memory device 20 automatically in response to certain events, without a reconfiguration command. In one embodiment, when memory device 20 is powered up, array control engine 24 configures reconfiguration registers used to replace CAMS. In another embodiment, prior to programming of a block, array control engine 24 trims the voltage level used during programming via a reconfiguration register.

Figure 2:
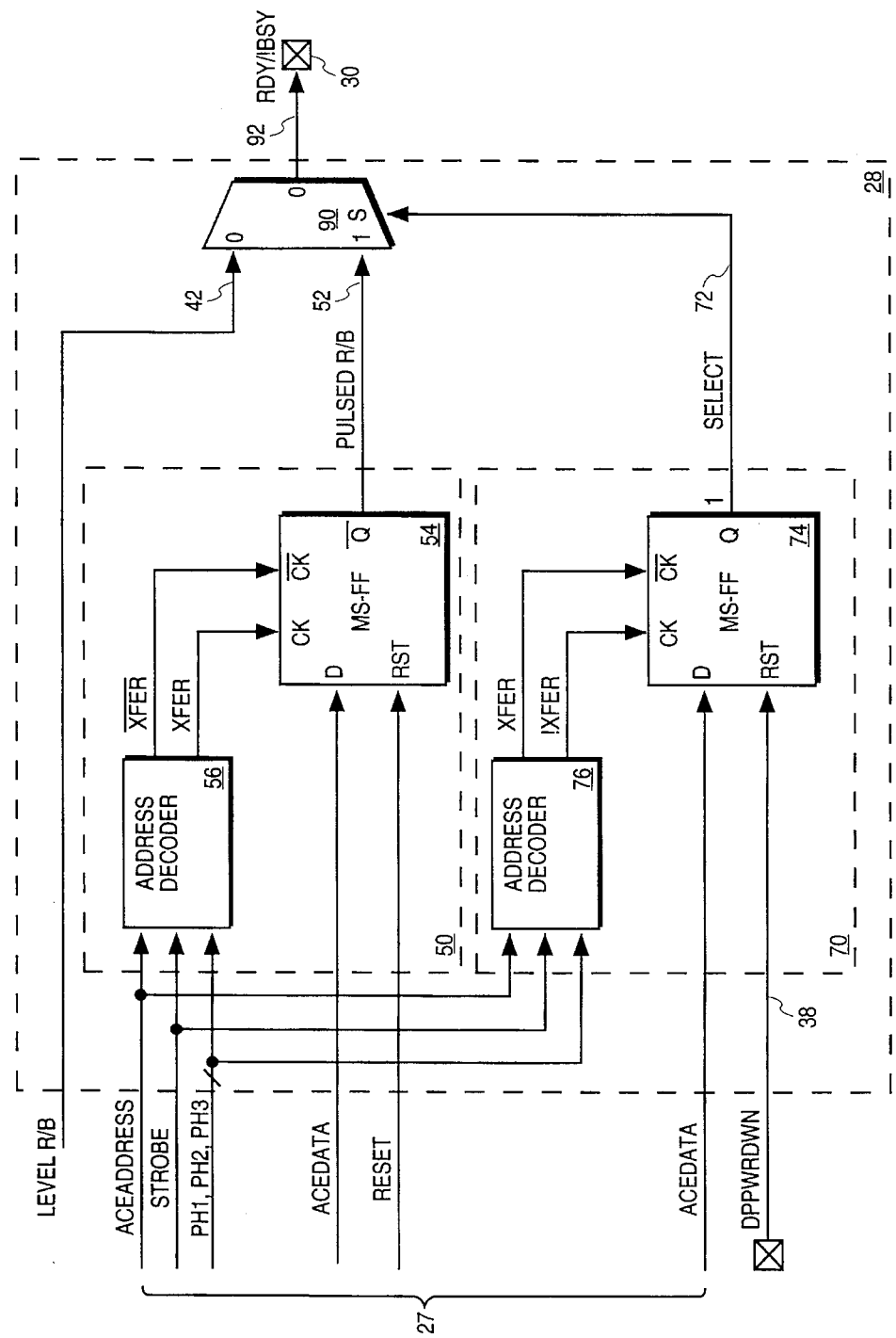
FIG. 2 illustrates a reconfiguration circuit.

Given this overview, consider now reconfiguration circuit 28, which is illustrated in FIG. 2. Reconfiguration circuit 28 includes register 50, reconfiguration register 70, and multiplexer 90. Register 50 generates a signal that pulses on completion of a command, Pulsed R/B 52. Register 50 does so under the control of array control engine 24. Multiplexer 90 selects between its two input signals 52 and Level R/B signal 42 depending upon the state of SELECT signal 72. Multiplexer output 92 is coupled to RDY/!BSY pin 30. Thus, reconfiguring RDY/!BSY pin 30 requires control of reconfiguration register 70, which generates SELECT signal 72.

Reconfiguration register 70 includes flip-flop 74 and address decoder 76. Flip-flop 74 generates SELECT signal 72 in response to the signals applied to D-input and the reset input of flip-flop 74. DPPWRDWN 38 is coupled to the reset input of flip-flop 74. While DPPWRDWN 38 is active high, SELECT signal 72 is forced to a logic low, as shown in Table I of FIG. 3. In response, multiplexer 90 couples Level R/B signal 42 to pin 30. Level R/B signal 42 remains coupled to pin 30 even after DPPWRDWN 38 returns to an inactive low state and memory device 20 begins operation. Thus, as shown in Table I of FIG. 3, after power-up and before reconfiguration, RDY/!BSY pin 30 follows Level R/B signal 42. That is to say, powering up memory device 20 brings RDY/!BSY pin 30 up in its historical configuration.

Figure 4:
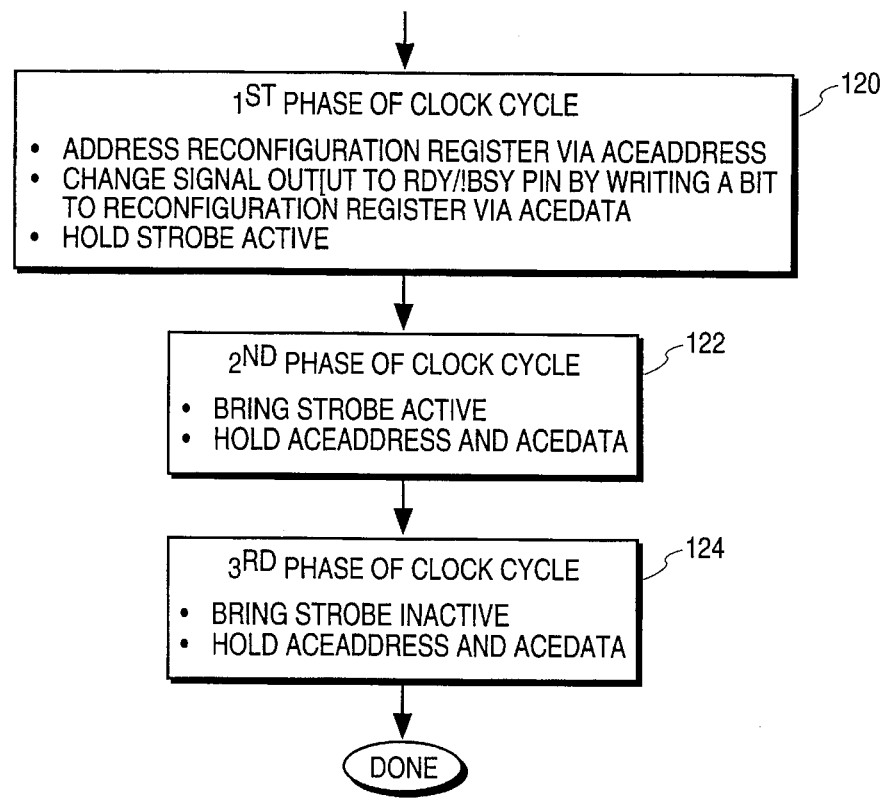
FIG. 4 illustrates in flow diagram form a method changing the signal coupled to a RDY/!BSY pin.

After power-up, changing the configuration of RDY/!BSY pin 30 requires changing the state of SELECT signal 72. This requires applying a logic one to the D-input of flip-flop 74 and clocking that data into flip-flop 74. Array control engine 24 performs both operations in response to a reconfiguration command. FIG. 4 illustrates in flow diagram form how array control engine 24 performs these operations using a clock signal having three phases, PH1, PH2 and PH3. In step 120, during the first active clock phase, array control engine 24 sets up the necessary address and data signals. Array control engine 24 addresses address decoder 56 within reconfiguration register 70 via address signals ACEADDRESS. Array control engine 24 sets up the data to be written into flip-flop 74, a logic 1, via data signal ACEDATA. Array control engine 24 holds the STROBE signal inactive during step 120 to prevent clocking flip-flop 74 and thereby changing the state of SELECT 72. Set-up complete, array control engine 24 advances to step 122. During the second active clock phase, array control engine 24 writes ACEDATA into flip-flop 74 by bringing active the STROBE signal. Provided that it has been properly addressed, address decoder 76 responds to the active STROBE signal by generating two pulses, XFER and !XFER. Flip-flop 74 uses these signals to clock in the data on its D-input. (Flip-flop 74 does not require two clock pulses when it is not realized as a master-slave device.) Finally, in step 124 during the third active clock phase, array control engine 24 brings the STROBE signal inactive and holds ACEDATA and ACEADDRESS to satisfy the hold time requirement of address decoder 56 and flip-flop 74.

It will be obvious to those of ordinary skill in the art, that use of a three phase clock signal is not necessary to the reconfiguration circuitry and method of the present invention.

Array control engine 24 writes to reconfiguration register 70 only once in response to a reconfiguration command. As a result, once RDY/!BSY pin 30 is reconfigured it remains so until the memory device user powers down memory device 20; i.e. DPPWRDWN 38 goes active. Control of RDY/!BSY pin configuration is thus completely within the control of the memory device user, who may switch between configurations using the reconfiguration command and DPPWRDWN pin 38.

After array control engine 24 writes to reconfiguration register 70, SELECT signal 72 changes state from a logic zero to a logic one. As a result, multiplexer output 92 follows Pulsed R/B signal 52. According to one embodiment, Pulsed RIB signal 52 is defined as normally a logic one except upon completion of an operation, when signal 52 pulses low for a period of time. Afterward, Pulsed R/B signal 52 returns to a logic one. This definition permits a user to monitor the status of multiple memory devices by wire-ORing together multiple RDY/!BSY pins.

Pulsed RIB signal 52 is generated by flip-flop 54 of register 50. Upon power-up, flip-flop 54 forces Pulsed R/B signal 52 to it inactive state, i.e., logic one. Flip-flop 54 does so in response to the RESET signal, from array control engine 24, which is applied to the reset input of flip-flop 54. Array control engine 24 brings the RESET signal active high during power-up and after completion of each command.

Figure 5:
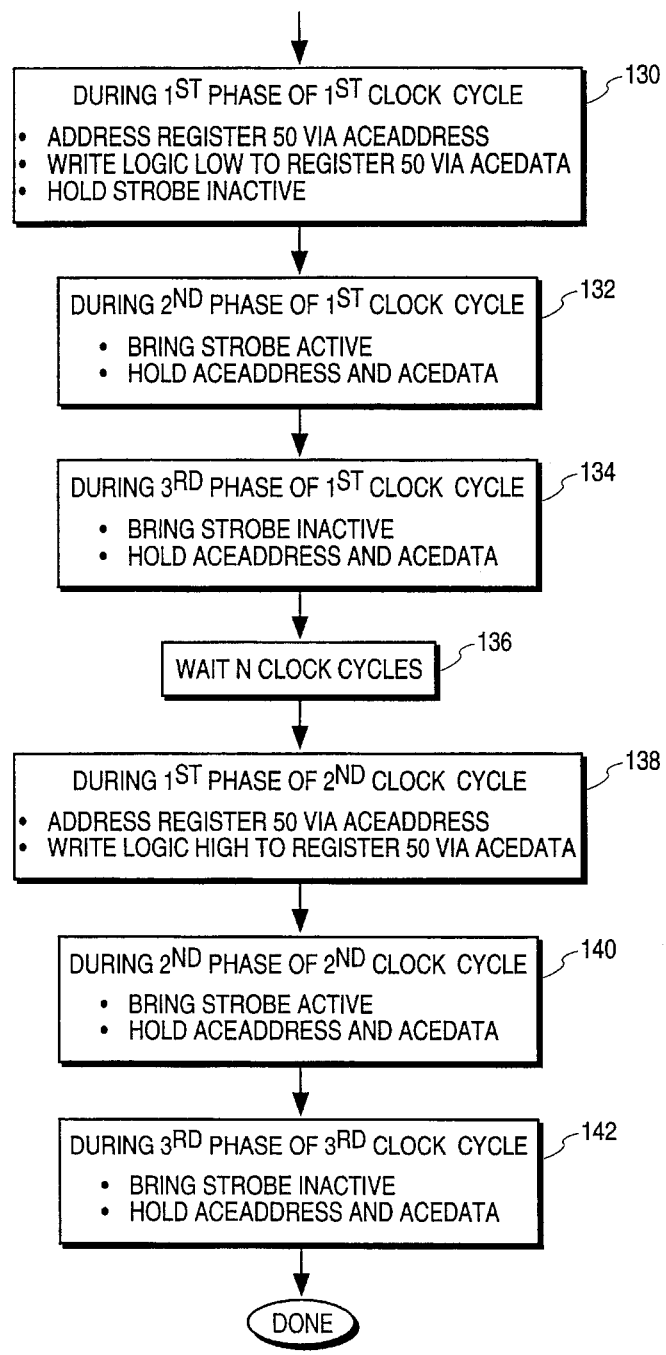
FIG. 5 illustrates in flow diagram form a method of pulsing a signal coupled to a RDY/!BSY pin upon completion of a command.

Upon completion of a command received subsequent to a pulse on completion command, array control engine 24 pulses low Pulsed R/B signal 52. Array control engine 24 does so by performing two writes to register 50. FIG. 5 illustrates in flow diagram form the steps array control engine 24 executes to pulse low signal 52. In steps 130, 132 and 134, array control engine 24 addresses address decoder 56 and writes to flip-flop 54 the data necessary to force signal 52 to a logic 0. Steps 130, 132 and 134 are accomplished in the same manner as steps 120,122 and 124, as discussed previously. Array control engine 24 then holds signal 52 active an arbitrary number of clock cycles, N, in step 138 simply by waiting that number of clock cycles. After sufficient time has elapsed, array control engine 24 forces Pulsed R/B signal 52 inactive high by performing another write to register 50, as illustrated in steps 138, 140 and 142 of FIG. 5. The sole difference between this write to register 50 and the previous write is the value of ACEDATA.

Figure 6:
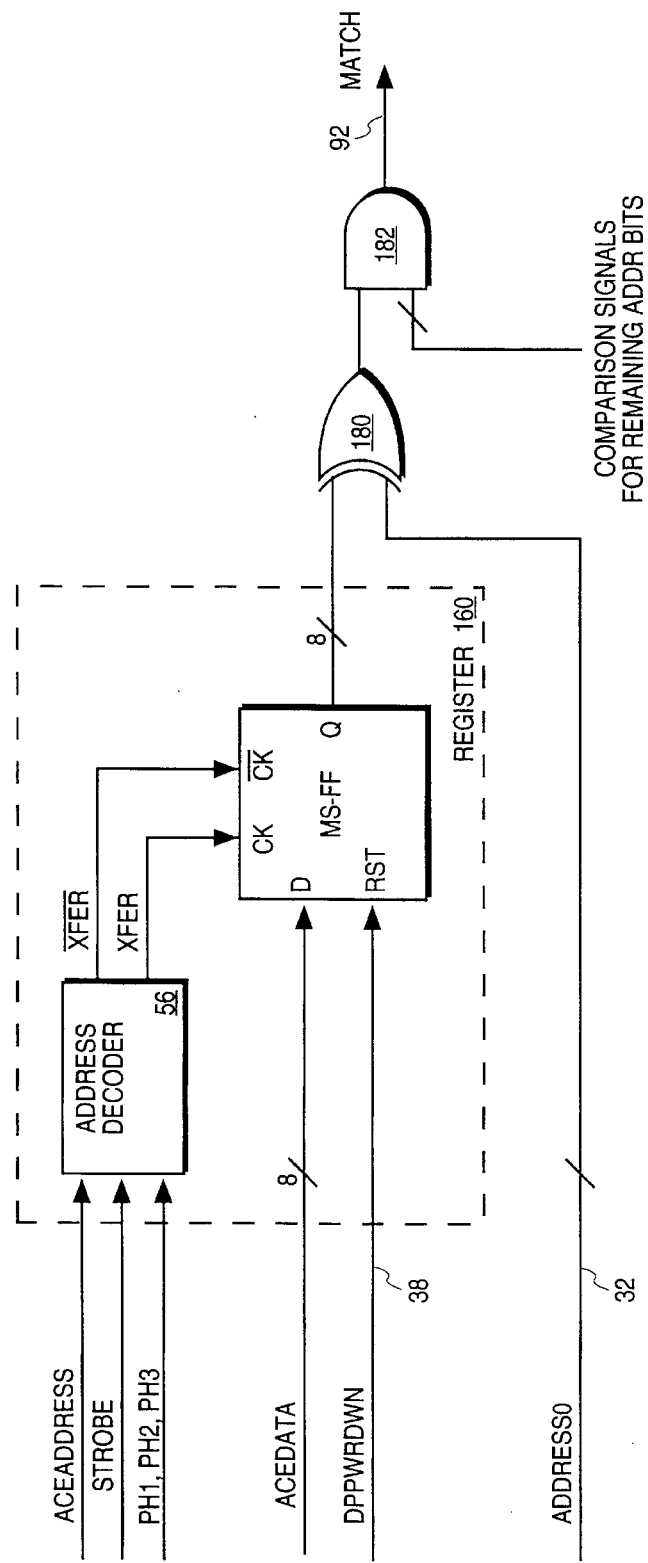
FIG. 6 illustrates in block diagram form a reconfiguration register that replaces a CAM bit circuit.

FIG. 6 illustrates reconfiguration register 160, which replaces a CAM bit circuit of a CAM. As is known in the art, CAMs are frequently used to replace defective memory cells within memory array 26 with redundant memory cells. Each CAM stores the address of a defective memory location and enables its associated redundant memory cells when access is requested to the defective memory location. A CAM typically includes a number of CAM bit circuits, each storing one bit of the address of the defective memory location. Each CAM bit circuit is coupled to a comparator 180. Each comparator 180 compares one address bit of address signal 32 to a CAM bit and indicates a match by outputting a logic one. AND gate 182 signals that the defective memory location stored by the CAM bit circuits has been addressed by address signals 32. AND 182 does so by bringing the MATCH signal active high. This triggers replacement of the defective memory location with the redundant memory elements.

Reconfiguration register 160 replaces a CAM bit circuit by storing one bit of the address of a defective memory location. The state of the bit stored by reconfiguration register 160 is controlled by array control engine 24. Array control engine 24 sets the bit to the desired state by performing a write to reconfiguration register 160 in the same manner discussed previously with respect to reconfiguration register 70. Once the bit is written, it is stored by reconfiguration register 160 until memory device 20 is powered down. This is because reconfiguration register 160 is reset by DPPWRDWN 38.

The volatility of reconfiguration register 160 does not prevent it from being a suitable replacement for a traditional, nonvolatile CAM bit circuit. This is because reconfiguration register 160 can be reconfigured automatically by array control engine 24 each time memory device 20 is powered up. Array control engine 24 recalls the address of the defective memory location using its nonvolatile program store.

Reconfiguration register 160 offers a number of advantages over a traditional a CAM bit circuit. Reconfiguration register 160 is cheaper to fabricate than a CAM bit circuit. This is because reconfiguration register 160 does not pose the same difficulties in lay-out, testing at sort or in reliability. Reconfiguration register 160 offers the additional advantage that defective memory locations can be identified after manufacture by the memory device user and replaced. This is not currently possible using CAM bit circuits.

Figure 7:
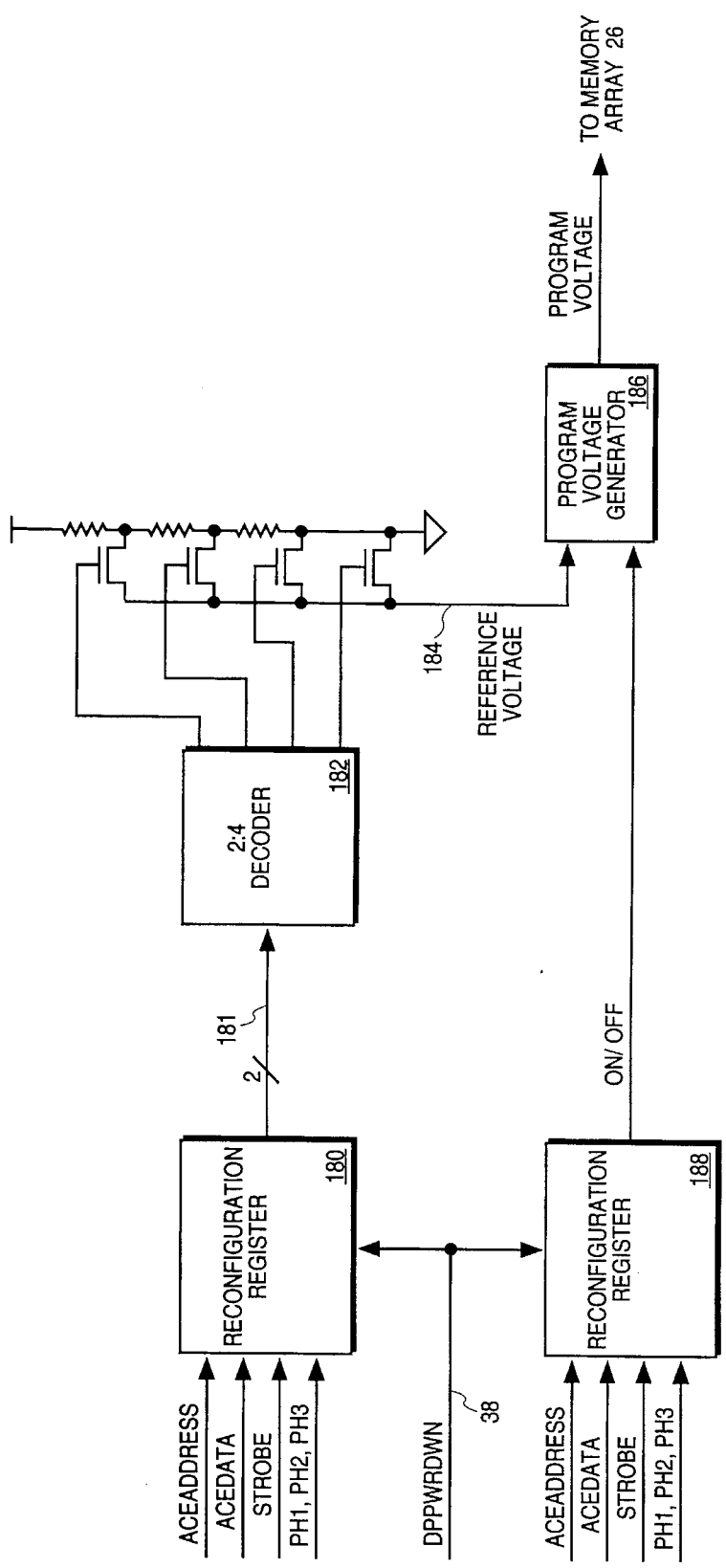
FIG. 7 illustrates in block diagram form a reconfiguration register used to trim/voltage levels used during programming.

FIG. 7 illustrates in block diagram form reconfiguration register 180, which is used to trim voltage levels used during programming. As with reconfiguration register 160, reconfiguration register 180 replaces a CAM bit circuit. Reconfiguration register 180 trims program voltage levels by controlling the state of the signals applied to decoder 182. Decoder 182 responds to signals 181 by setting reference voltage 184 to one of four possible voltage levels. Program voltage generator 186 uses reference voltage 184 to generate the voltage applied to nonvolatile memory array 26 during programming. Program voltage generator 186 is turned ON and OFF by reconfiguration register 188.

Reconfiguration registers 186 and 188 are controlled by array control engine 24 in the same manner described above with respect to reconfiguration registers 160 and 70. Replacing CAMs with reconfiguration registers 186 and 188 offers many of the same advantages discussed previously with respect to reconfiguration register 160. Additionally, reconfiguration register 186 allows trimming of program voltage levels to account for changes in memory array program characteristics caused by aging. To do so, array control engine characterizes memory array 26 from time to time and changes reference voltage 184 as appropriate by writing to reconfiguration register 180 after first powering down and then powering up memory device 20.

Figure 8:
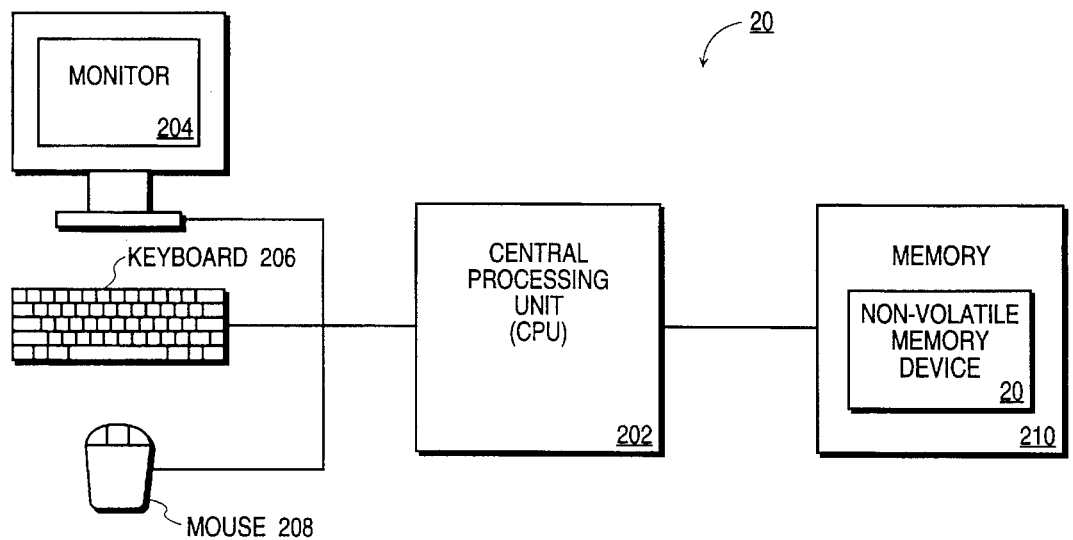
FIG. 8 illustrates a computer system including a nonvolatile memory device using reconfiguration registers.

FIG. 8 illustrates in block diagram form personal computer 200. Personal computer 200 includes central processing unit (CPU) 202 and monitor 204 for visually displaying information to a computer user. Keyboard 206 allows the computer user to input data to CPU 202. By moving mouse 208 the computer user is able to move a pointer displayed on monitor 204. Memory 210 stores data used by CPU 202. Memory 210 typically includes a magnetic disk drive for mass memory storage. Memory 210 also typically includes nonvolatile semiconductor memory devices 20 for storage of data that must be frequently and rapidly accessed. These memory devices includes the reconfiguration circuits of the present invention.

Thus, a number of reconfiguration registers have been described that permit modification of a flash memory subsequent to manufacture and sort. Each reconfiguration register includes a flip flop, whose output is controlled by a control engine. Controlling these registers via the control engine permits modification of the flash memory while it is running.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A reconfiguration circuit in an integrated circuit for redefining a first signal, the reconfiguration circuit reconfiguring the integrated circuit after manufacture of the integrated circuit in response to a command, the reconfiguration circuit comprising:

a) a multiplexer coupled to a first input signal, a second input signal, and a select signal, the multiplexer outputting the first signal, the first signal following the first input signal when the select signal is in a first state and following the second input signal when the select signal is in a second state; and b) a first register outputting the select signal, the first register bringing the select signal to the first state in response to a reset signal and bringing the select signal to the second state in response to the command.

2. The reconfiguration circuit of claim 1, wherein the reset signal is controlled by a user of the integrated circuit.

3. The reconfiguration circuit of claim 1 wherein the first register comprises:

a) a first flip-flop having a first data input coupled to a first data signal, the first data signal being responsive to the command, the first flip-flop outputting the select signal.

4. The reconfiguration circuit of claim 3, wherein the first flip flop includes a first reset input coupled to the reset signal that is controlled by a user of the integrated circuit.

5. The reconfiguration circuit of claim 3 wherein the first flip-flop includes a clock input, and wherein the first register further comprises:

b) a first clock circuit for coupling a first clock signal to the clock input of the first flip-flop in response to the command.

6. The reconfiguration circuit of claim 1 further comprising:

c) a second register generating the second input signal, the second input signal having a first state and a second state defined in response to the command.

7. The reconfiguration circuit of claim 6 wherein the second register comprises:

a) a second flip-flop having a second data input coupled to a second data signal, the second data signal being responsive to the command, the second flip-flop outputting the second input signal.

8. The reconfiguration circuit of claim 7 wherein the second flip-flop includes a second clock input, and wherein the second register further comprises:

b) a second clock circuit for coupling a second clock signal to the second clock input of the second flip-flop in response to the command.

9. A reconfiguration circuit in an integrated circuit including a first pin for coupling a first signal to a user, the reconfiguration circuit redefining the first signal in response to a command from the user, the reconfiguration circuit comprising:

a) a multiplexer coupled to a first input signal, a second input signal, a select signal and outputting the first signal to the first pin, the first signal following the first input signal when the select signal is in a first state and following the second input signal when the select signal is in a second state; and b) a first register outputting the select signal, the first register bringing the select signal to the first state in response to an active reset signal from the user and bringing the select signal to the second state in response to the command, the first register holding the select signal in the second state in response to an inactive reset signal.

10. The reconfiguration circuit of claim 9 wherein the first signal indicates whether the integrated circuit is busy performing a task or is ready to perform another task.

11. The reconfiguration circuit of claim 10 wherein the first input signal outputs a first voltage level while the integrated circuit is busy performing a task and outputs a second voltage level while the integrated circuit is ready to perform a task.

12. The reconfiguration circuit of claim 11 wherein the second input signal pulses from the first voltage level to the second voltage level when the integrated circuit is through performing a task.

13. The reconfiguration circuit of claim 9, wherein the first register comprises:
   a) a first flip-flop having a first data input and a first reset input, the first data input being coupled to a first data signal that is responsive to the command, the first reset input being coupled to the reset signal, the fist flip-flop outputting the select signal.

14. The reconfiguration circuit of claim 13 wherein the first flip-flop includes a clock input, and wherein the first register further comprises:
   b) a first clock circuit for coupling a first clock signal to the clock input of the first flip-flop in response to the command.

15. The reconfiguration circuit of claim 12, further comprising:
   c) a second register generating the second input signal from a second data signal, the second data signal pulsing from the first voltage level to the second voltage level when the integrated circuit is through performing a task.

16. Reconfiguration circuitry in an integrated circuit memory for reconfiguring the integrated circuit memory after manufacture, the integrated circuit memory including a memory array and a controller, the memory array including a first memory cell and a second memory cell, the controller storing a first memory array address of the first memory cell within the memory array, the first memory cell storing a first bit of data, the reconfiguration circuitry indicating when the first bit of data should be replaced with a second bit of data stored in the second memory cell, the reconfiguration circuitry comprising:
   a) a register for storing and outputting the first memory array address, the first memory array address being input to the register by the controller; and
   b) match means for comparing the first memory array address to a second memory array address representing a memory location to be accessed within the memory array, the match means indicating that the first bit of data should be replaced with the second bit of data when the second memory array address matches first memory array address.

17. The reconfiguration circuitry of claim 16 wherein the register comprises:
   a) a flip-flop.

18. In a integrated circuit memory, a method of replacing a defective memory element in a memory array with a redundant memory element, the defective memory element having a first address, the integrated circuit including a controller for controlling operations on the main memory array, the controller including a nonvolatile control store, the nonvolatile control store storing the first address, the method comprising:
   a) writing the first address from the nonvolatile control store to a register;
   b) comparing an output of the register to a second address associated with a request to access the memory array; and
   c) replacing the defective memory element with the redundant memory element if the first address signal and the second address match.

19. A reconfiguration circuit in an integrated circuit for redefining an output signal on an output pin on the integrated circuit, comprising:
   (A) a multiplexer coupled to a first signal, a second signal, and a select signal, the multiplexer outputting the first signal on the output pin when the select signal is at a first state and outputting the second signal on the output pin when the select signal is at a second state; and
   (B) a first register coupled to the multiplexer, the first register outputting the select signal at the first state in response to receiving a reset signal and outputting the select signal at the second state in response to receiving a command signal.

20. The reconfiguration circuit of claim 19, wherein the reset signal is controlled by a user of the integrated circuit.

21. The reconfiguration circuit of claim 19, wherein the first register comprises a first flip-flop having a first data input receiving the command signal and having a second data input receiving the reset signal.

22. The reconfiguration circuit of claim 19 further comprising a second register coupled to the multiplexer, the second register generating the second signal.

23. The reconfiguration circuit of claim 22, wherein the second register generates the second signal to one of a first state and a second state in response to the command signal.

* * * * *

UNITED STATES PATENT AND TRADEMARK OFFICE
CERTIFICATE OF CORRECTION

| | | |
|---|---|---|
| PATENT NO. | : | 5,574,850 |
| DATED | : | November 12, 1996 |
| INVENTOR(S) | : | Mickey L. Fandrich |

It is certified that error appears in the above-identified patent and that said Letters Patent is hereby corrected as shown below:

In column 3 at line7 delete "trim/voltage" and insert --trim voltage--

In column 4 at line 35 delete ""Pulse On Completion" and insert --"Pulse-On Completion"--

In column 5 at line 59 delete "RIB" and insert --R/B--

In column 5 at line 66 delete "RIB" and insert --R/B--

In column 9 at line 8 delete "fist" and insert --first--

Signed and Sealed this

Sixth Day of May, 1997

*Attest:*

BRUCE LEHMAN

*Attesting Officer*         *Commissioner of Patents and Trademarks*